(12) United States Patent
Ponte

(10) Patent No.: US 6,202,172 B1
(45) Date of Patent: Mar. 13, 2001

(54) SMART DEBUG INTERFACE CIRCUIT

(75) Inventor: Christian Ponte, Colle sur Loup (FR)

(73) Assignee: VLSI Technology, Inc., San Jose, CA (US)

(*) Notice: Subject to any disclaimer, the term of this patent is extended or adjusted under 35 U.S.C. 154(b) by 0 days.

(21) Appl. No.: 09/095,729

(22) Filed: Jun. 10, 1998

Related U.S. Application Data

(62) Division of application No. 08/808,341, filed on Feb. 28, 1997.

(51) Int. Cl.$^7$ .............................. H02H 0/05; G06F 7/38
(52) U.S. Cl. ............................................. 714/31; 712/227
(58) Field of Search ................... 714/31, 38, 30, 714/45, 725, 728; 712/227

(56) References Cited

U.S. PATENT DOCUMENTS

| | | | |
|---|---|---|---|
| 5,544,311 | * | 8/1996 | Harenberg et al. ............... 714/40 |
| 5,598,421 | * | 1/1997 | Tran et al. ........................ 714/726 |
| 5,706,297 | * | 1/1998 | Jeppesen III et al. ............ 714/30 |
| 5,708,773 | * | 1/1998 | Jeppesen III et al. ............ 714/30 |
| 5,724,505 | * | 3/1998 | Argade et al. .................... 714/45 |
| 5,862,148 | * | 1/1999 | Typaldos et al .................. 371/22.1 |
| 5,915,083 | * | 6/1999 | Ponet ................................ 714/30 |
| 5,956,477 | * | 9/1999 | Ranson et al. .................... 714/30 |

* cited by examiner

Primary Examiner—Dieu-Minh T. Le
(74) Attorney, Agent, or Firm—Wagner, Murabito & Hao LLP

(57) ABSTRACT

The present invention comprises a smart debug interface circuit for the diagnostic testing and debugging of a software application for a programmable digital processor system. The smart debug interface circuit of the present invention includes an instruction register for coupling to an instruction bus of a programmable digital processor. The instruction register is adapted to drive instructions onto the instruction bus. The instruction register couples to the instruction bus in a parallel manner. The smart debug interface circuit of the present invention includes a data register for coupling to a data bus of the programmable digital processor. The data register is adapted to read data from the data bus and couples to the data bus in a parallel manner. The instruction register and data register are each coupled to an interface port. The interface port couples the smart debug interface circuit to a host computer system. A control logic circuit is also included in the smart debug interface circuit of the present invention. The control logic circuit is coupled to the instruction register, the data register, and the interface port. The control logic circuit interfaces a debugging program on the host computer system to the programmable digital processor. Additionally, the control logic circuit interfaces the debugging program with the programmable digital processor without imposing boundary scan bus delay on the instruction bus or the data bus.

3 Claims, 5 Drawing Sheets

SMART DEBUG INTERFACE CIRCUIT

This is a divisional of application Ser. No. 08/808,341 filed on Feb. 28, 1997 which designated in the U.S.

TECHNICAL FIELD

The field of the present invention pertains to diagnostic testing and debugging of integrated circuit devices. More particularly, the present invention relates to a optimized diagnostic testing and debugging interface circuit for debugging programmable digital processor applications.

BACKGROUND ART

Many devices common to every day life utilize complex integrated circuits. Examples include desktop computer systems, video games, vending machines, and even pay phones. These devices often include programmable digital processors embedded within their systems. The digital processors typically implement any required user interface (e.g., a menu of choices) and execute the actual electronic processing required to implement user requests (e.g., place a phone call or order a service). The more complicated and sophisticated the device, the more complex the system including the programmable digital processor.

As these devices and their applications have become more sophisticated, the task of designing, testing, and debugging the digital systems implementing these devices his become much more difficult. The ever increasing sophistication dictates ever more densely populated integrated circuit boards and more highly integrated components. Validation of the system design and verification of proper functionality of the devices has become a major concern in developing new device applications.

In response to this concern, the electronics industry, under the auspices of the Institute of Electrical and Electronics Engineers (IEEE) has implemented a widely used and widely supported industry standard for the building of electronic devices. This standard, IEEE 1149.1-1990, was developed and promulgated by an industry Joint Test Action Group (JTAG). The "JTAG specification" requires that both system level and board level electronic devices include test access ports (TAPs) which allow access to internal circuit nodes and registers which are otherwise virtually inaccessible. The JTAG standard further describes a "boundary scan" architecture, an internal "serial scan" architecture, and a state machine which allows access to the state of internal signals and busses and the context of internal registers.

To implement the JTAG boundary scan architecture, the component or circuit board of a device needs to include boundary scan cells which are implemented between each component pin or circuit board connector. The boundary scan cells are connected together to form a scan chain (e.g., a shift register path) around the periphery of the integrated circuit, hence giving rise to the term "boundary scan".

To implement the JTAG serial scan architecture, the component or circuit board of a device needs to include scan cells directly within the circuitry comprising the integrated circuit or component. While boundary scan cells are confined to the periphery, serial scan cells are located within the circuitry of the individual components or circuit boards. Serial scan cells can provide access to internal signals and internal registers which are inaccessible using boundary scan cells. The individual serial scan cells are connected serially to form a serial scan chain through the interior of the integrated circuit.

Both serial scan chains and boundary scan chains couple to a JTAG TAP (test access port). The TAP implements a JTAG compliant state machine which provides a standardized method of accessing the boundary scan architecture and/or serial scan architecture. The TAP is, in turn, coupled to a computer system which runs a testing and debugging program.

With reference now to prior art FIG. 1, a system 100 incorporating a boundary scan chain is shown. System 100 includes a programmable digital processor (e.g., digital signal processor 101) having a eight data bus lines 103a–110a. Each of the data bus lines 103a–110a couple to a corresponding boundary scan cell 121–128 and subsequently couple to a memory controller 102 via bus lines 103b–110b. As described above, each of boundary scan cells 121–128 couple serially to a TAP 130 via line 115. The boundary scan cells 121–128 can function as latches, latching the value present on bus lines 103a–110a as dictated by a debugging program via TAP 130. The boundary scan cells 121–128 can also function as drivers, meaning they can drive values onto bus lines 103b–110b. For example, when system 100 functions normally, signals present on bus lines 103a–110a are "passed through" to bus lines 103b–110b via boundary scan cells 121–128. However, when system 100 functions in debug mode, boundary scan cells 121–128 can either read the values on bus lines 103a–110a as they are passed through, or can drive test values onto bus lines 103b–110b comprising test instructions for digital signal processor 101.

There is a problem, however, in the fact that the test circuitry included in a device is not "transparent" to the circuitry comprising the device. For example, in system 100, the circuitry comprising TAP 130 and boundary scan cells 121–128 have a number of adverse impacts on the performance of digital signal processor 101. By inserting scan cells 121–128 between the digital signal processor 101 and the memory controller 102, the bus between the digital signal processor 101 and the memory controller 102 is "broken" into two resulting busses comprised of bus lines 103a–110a and 103b–110b. By breaking the bus in this manner, a boundary scan delay is added to each word transmitted from digital signal processor 101 to memory controller 102, as the word is passed through boundary scan cells 121–128. The more demanding the application system 100 implements, the more problematic the boundary scan delay becomes.

There is a problem with serial scan chain architectures also. Although serial scan cells might avoid inducing boundary scan delays, the incorporation of serial scan cells into the circuitry of integrated circuit devices tends to be very expensive. To incorporate serial scan cells into an integrated circuit, the circuitry comprising the integrated circuit needs to be redesigned to include the circuitry comprising the serial scan cells. For example, for digital signal processor 101 to incorporate a serial scan chain, the circuitry comprising the serial scan chain is design into the circuitry comprising digital signal processor 101. This increases the transistor count of digital signal processor 101, the area of silicon required to fabricate digital signal processor 101, and the complexity of digital signal processor 101.

To avoid the above problems associated with serial scan chains and boundary scan chains, many system designers are incorporating specialized test monitoring code in the applications running on system 100. The test monitoring code records the information via software as opposed to hardware. The test monitoring software, however, increases the size of the memory required for storing the "normal" application software. For some applications (e.g., a pay phone) this can be very problematic.

Thus, what is required is a solution which does not have the disadvantages of the prior art. The required solution should provide the benefits of conventional test interfaces while avoiding the adverse impacts on the programmable digital processor system under test. The required solution should be fully compatible with the industry standard JTAG interface. The required solution should not increase the size of the programmable digital processor integrated circuit by including numerous serial scan cells. The required solution should not impose a boundary scan delay by breaking the busses coupled to the programmable digital processor with boundary scan cells. Additionally, the required solution should not increase the amount of memory required to store the application software of the programmable digital processor system. The present invention satisfies the above requirements.

DISCLOSURE OF THE INVENTION

The present invention comprises a smart debug interface circuit for performing diagnostic tests on a digital processor system. The smart debug interface circuit of the present invention includes an instruction register for coupling to an instruction bus of a programmable digital processor. The instruction register is adapted to drive instructions onto the instruction bus and read instructions from the instruction bus. The instruction register couples to the instruction bus in a parallel manner. The smart debug interface circuit of the present invention includes a data register for coupling to a data bus of the programmable digital processor. The data register is adapted to read data from the data bus and couples to the data bus in a parallel manner. The instruction register and data register are each coupled to an interface port. The interface port couples the smart debug interface circuit to a host computer system. A control logic circuit is also included in the smart debug interface circuit of the present invention. The control logic circuit is coupled to the instruction register, the data register, and the interface port. The control logic circuit interfaces a debugging program on the host computer system to the programmable digital processor. Additionally, the control logic circuit interfaces the debugging program with the programmable digital processor without imposing boundary scan bus delay on the instruction bus or the data bus.

In this manner, the smart debug interface circuit of the present invention provides a diagnostic trouble shooting and debugging solution which provides the benefits of conventional test interfaces while avoiding their associated adverse impacts on the programmable digital processor system under test. The system of the present invention is fully compatible with the industry standard JTAG interface. The system of the present invention does not increase the size of the programmable digital processor integrated circuit by including numerous serial scan cells. In addition, the system of the present invention does not impose a boundary scan delay by breaking the programmable digital processor busses with boundary scan cells. As a further advantage, the smart debug interface circuit of the present invention does not increase the amount of memory required to store the application software of the programmable digital processor system.

BRIEF DESCRIPTION OF THE DRAWINGS

The present invention is illustrated by way of example and not by way of limitation, in the figures of the accompanying drawings and in which like reference numerals refer to similar elements and in which.

Prior Art

BEST MODE FOR CARRYING OUT THE INVENTION

A smart debug interface circuit for performing diagnostic testing and debugging of a programmable digital processor system is disclosed. In the following description, for the purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring the present invention.

The present invention comprises a smart debug interface circuit for performing diagnostic testing and debugging of a programmable digital processor system. The smart debug interface circuit of the present invention is a JTAG compliant interface for debugging, diagnosing, and trouble shooting devices incorporating programmable digital processors. The present invention includes a debugging program running on an external host computer system. The debugging program is interfaced with the programmable digital processor device via the smart debug interface circuit, allowing the efficient and accurate trouble shooting of the programmable digital processor device. Additionally, the control logic circuit interfaces the debugging program with the programmable digital processor without imposing boundary scan bus delay on the instruction bus or the data bus of the programmable digital processor device. In this manner, the smart debug interface circuit of the present invention provides a diagnostic trouble shooting and debugging solution providing the benefits of conventional test interfaces while avoiding their associated adverse impacts on the programmable digital processor system under test. The system of the present invention is fully compatible with the industry standard JTAG interface, does not increase the size of the programmable digital processor integrated circuit by including numerous serial scan cells, and does not impose a boundary scan delay from breaking the programmable digital processor busses. The present invention and its benefits are described in greater detail below.

Figure 1:
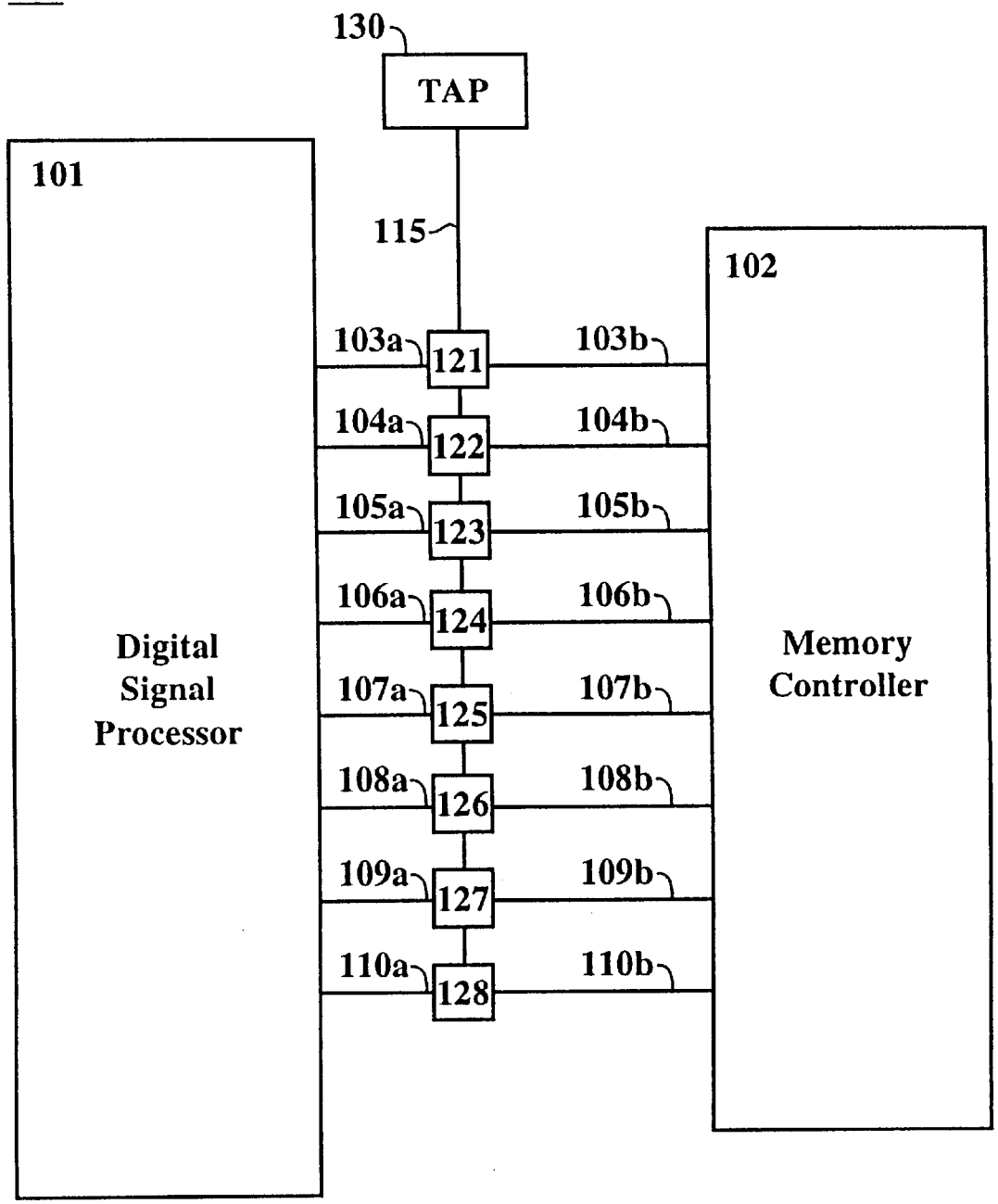
FIG. 1 shows a programmable digital processor system incorporating a boundary scan chain.
Figure 2:
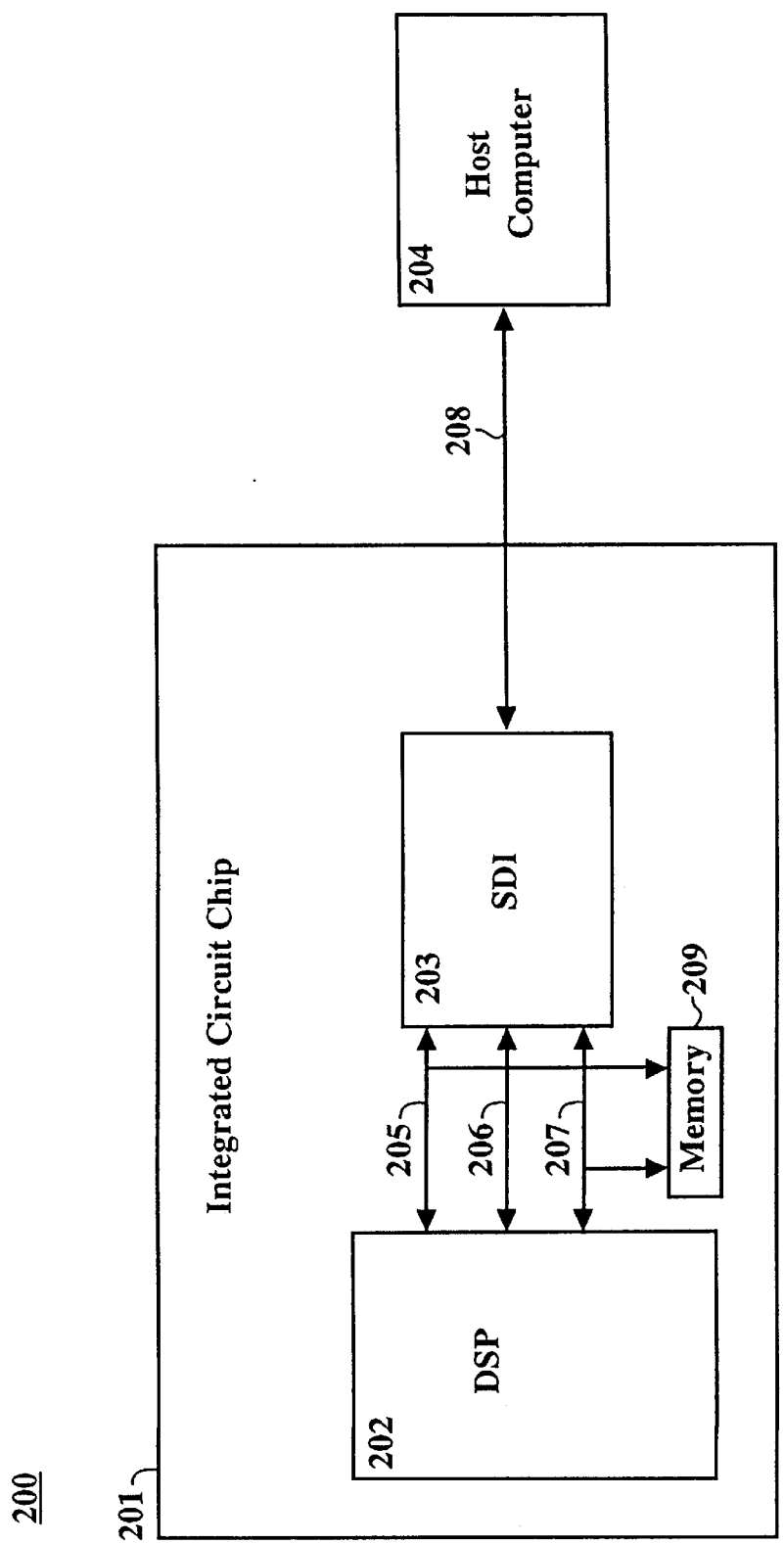
FIG. 2 shows a block diagram of a system incorporating a smart debug interface circuit in accordance with one embodiment of the present invention.

FIG. 2 shows a block diagram of a system 200 incorporating a smart debug interface circuit in accordance with one embodiment of the present invention. In the present embodiment, system 200 includes a digital signal processor (DSP) 202, a smart debug interface circuit (SDI) 203, and a host computer system 204. The DSP 202 is coupled to the smart debug interface circuit 203 via an instruction bus 205, a control bus 206, and a data bus 207. The smart debug interface circuit 203 is coupled to host computer system 204 via a JTAG interface bus 208. The DSP 202 is also coupled to a memory 209 via instruction bus 205 and data bus 207. The DSP 202, instruction bus 205, control bus 206, data bus 207, memory 209, and smart debug interface circuit 203 are fabricated into a single integrated circuit 201. The integrated circuit 201 is coupled to host computer system 204 via interface bus 208.

The smart debug interface circuit 203 functions by interfacing a debugging program on host computer system 204 to DSP 202. Using a debugging program in accordance with the present invention, a user is able to run diagnostics, test, and debug applications using DSP 202. The present invention implements these functions by coupling to the instruction bus 205 and the data bus 207 in parallel. In so doing, the SDI 203 is able to manipulate DSP by driving instructions onto instruction bus 205 and reading the data from data bus 207.

When the integrated circuit 201 is to be debugged, the SDI 203 of the present invention places DSP 202 into a wait state. The SDI 203 subsequently places memory 209 into tristate and drives an instruction onto instruction bus 205. The SDI 203 also tristates any other devices which may be coupled to instruction bus 205. The SDI 203 then runs DSP 202 for one cycle and DSP 202 fetches the instructions provided by SDI 203. In this manner, DSP 202 steps through instructions provided by SDI 203 as opposed to memory 209. By stepping through instructions one at a time, the debugging program on host computer system 204 is able to trouble shoot and diagnose any problems in the application software for the integrated circuit 201.

The debugging program maintains an internally emulated "copy" of DSP 202 in software. Using this emulated version of DSP 202, the debugging program maintains the contents and context of the internal registers and internal busses as it steps through instructions one at a time. Any specific instruction can be passed to DSP 202 via SDI 203. The order and nature of these instructions and the resulting changes in the internal registers and busses are then verified against the expected results. In this manner, a user of system 200 debugs application software for the integrated circuit 201.

In prior art debugging systems, a monitor program is often used to gain access to the contents of internal registers and internal bus signals. The test monitoring code of the prior art monitor program records the state of the internal signals and busses of a DSP and the context of the DSP's internal registers. The prior art monitor program increases the size of the memory (e.g.,, memory 209) required for storing normal application software. Debugging and trouble shooting a system in accordance with the present invention (e.g., system 200), however, does not require a test monitor program running from the memory of the DSP (e.g., DSP 202). In system 200, the debugging program runs on host computer system 204. The debugging program maintains the contents and context of the internal registers and busses within the memory of host computer system 204 via emulation. Hence, the memory 209 coupled to DSP 202 is not impacted.

As such, the system of the present invention does not require monitor software running on DSP 202. The SDI 203 of the present invention allows the testing and debugging of the integrated circuit 201 without concurrently running monitor software on DSP 202. Although inclusion of SDI 203 in integrated circuit 201 increases the transistor count of integrated circuit 201, the amount of the increase is much smaller than the increase involved in adding a larger memory 209 to accommodate a monitor program.

The SDI 203 includes a four pin JTAG compliant TAP for interfacing with host computer system 204. The TAP of SDI 203 is coupled to host computer system 204 via interface bus 208. The present invention is fully compliant with the standard JTAG interface. By using a JTAG four pin interface, the system of the present invention has minimal impact on the pin count of integrated circuit 201. While portions of the standard JTAG interface are described herein, the structure and operation of the standard JTAG interface is well known and widely used by those skilled in the art. Those desiring additional details or knowledge of the standard JTAG interface are referred to the Institute of Electronic and Electrical Engineers (IEEE) Standard 1149.1-1990, entitled "IEEE Standard Test Access Port and Boundary Scan Architecture", which is hereby expressly incorporated by reference as background material. Accordingly, the SDI 203 of the present invention, like any other IC chip complying with this standard, has a test access port (TAP) and an associated test access port controller (TAPC). The standard precisely defines the manner in which communication between the IC via the TAP and the debugging program on host computer system 204 takes place. Industry wide adherence to the standard allows for interchangeability of ICs along differing manufactures, in so far as testing is concerned.

It should be appreciated that, though the SDI 203 of the present invention and DSP 202 are integrated into a single integrated circuit (e.g., integrated circuit 201), the system of the present invention is suited for use with differing levels of integration. For example, SDI 203 can be implemented in programmable logic, on an integrated circuit separate from DSP 202, where the appropriate signals are available outside the integrated circuit containing DSP 202.

It should further be appreciated that SDI 203 of the present invention has full read and write access to DSP 202. As described above, SDI 203 is coupled to DSP 202 via instruction bus 205, control bus 206, and data bus 207. This gives SDI 203 the ability to read from and write to the registers of DSP 202 and memory 209. Thus, the debugging program on host computer system 204 can read from and write to both the registers of DSP 202 and the address space of memory 209. Instructions are passed to DSP 202 and data read from DSP 202 via a TAP within SDI 203.

The system of the present invention provides for an unlimited amount of software based break points. The software break points are provided via the emulation of DSP 202 in host computer system 204 and provide a means for stopping an application program running on DSP 202 for debugging at specific points. The emulation of DSP 202 (e.g., the values of the internal registers and the like) are maintained in the memory of host computer system 204 by the debugging program. The SDI 203 keeps the number of hardware break points low, ensuring the logic circuitry comprising SDI 203 remains small and compact (e.g., less than 3000 logic gates). The small size reduces the real estate impact on integrated circuit 201.

Figure 3:
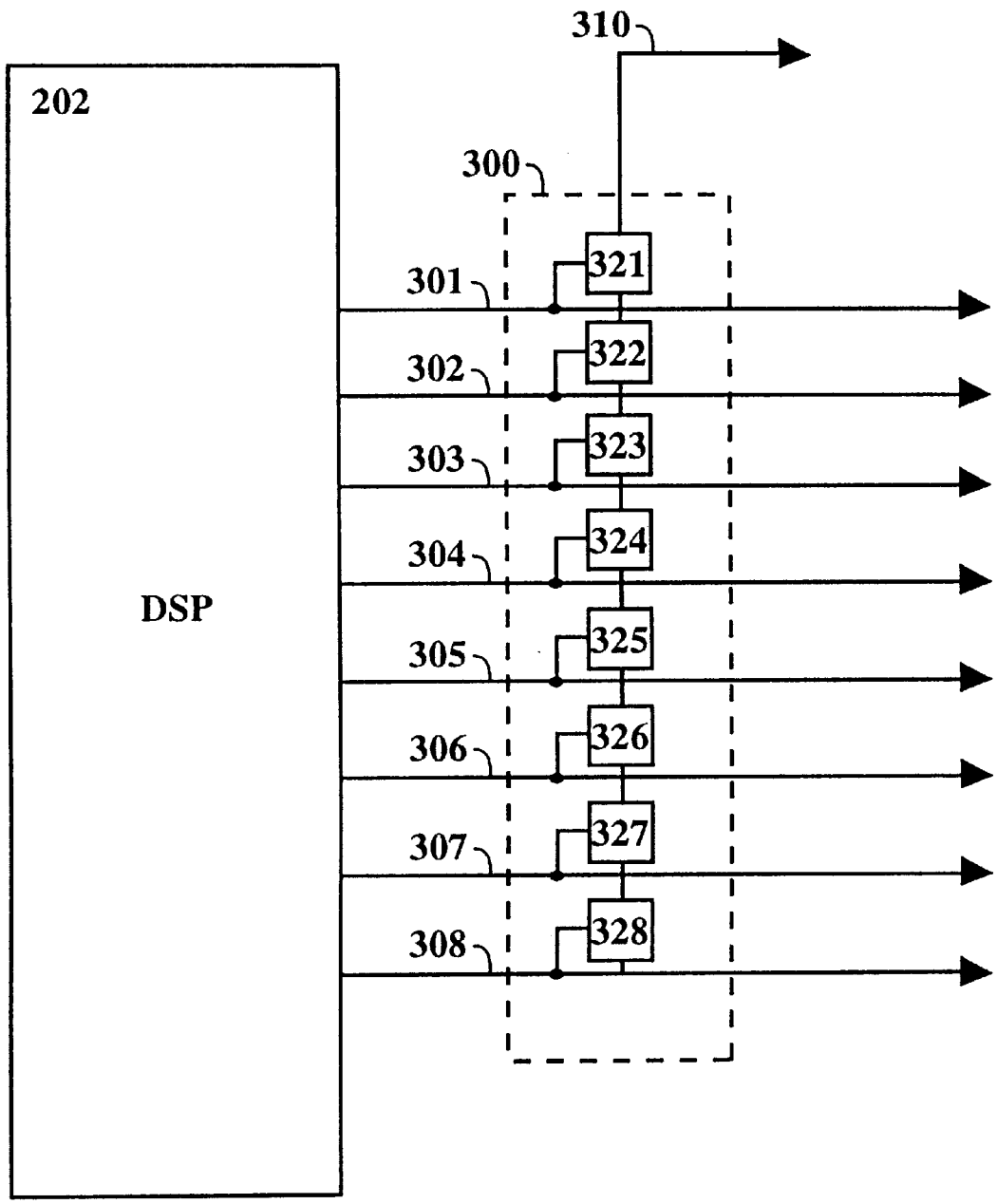
FIG. 3 shows a plurality of scan cells in accordance with the present invention.

With reference flow to FIG. 3, a plurality of scan cells 300 in accordance with the present invention are shown. A typical DSP (e.g., DSP 202) incorporates separate address and data lines for its respective instruction bus (e.g., instruction bus 205) and data bus (e.g., data bus 207) In the present embodiment, bus lines 301–308 comprise the data lines of the instruction bus 205 shown in FIG. 2, however, it should be appreciated that a similar plurality of scan cells of are likewise coupled to the data bus 207 of FIG. 2. Each of the scan cells 321–328 is coupled to a respective data line 301–308. The plurality of scan cells 300 collectively comprise a shift register in SDI 203 and are used to read data from and/or drive data onto the data lines 301–308. The scan cells 300 are coupled to the rest of the circuitry comprising SDI 203 via line 310.

It should be noted that the plurality of scan cells 300 are coupled in parallel to data lines 301–308. As such, the plurality of scan cells 300 do not "break" data lines 301–308. Thus, the DSP 202 and other devices coupled to data lines 301–308 are not slowed by the inclusion of the plurality of scan cells 300. In this manner, the SDI of the present invention does not impose a boundary scan delay by breaking the DSP 202 busses with boundary scan cells.

Figure 4:
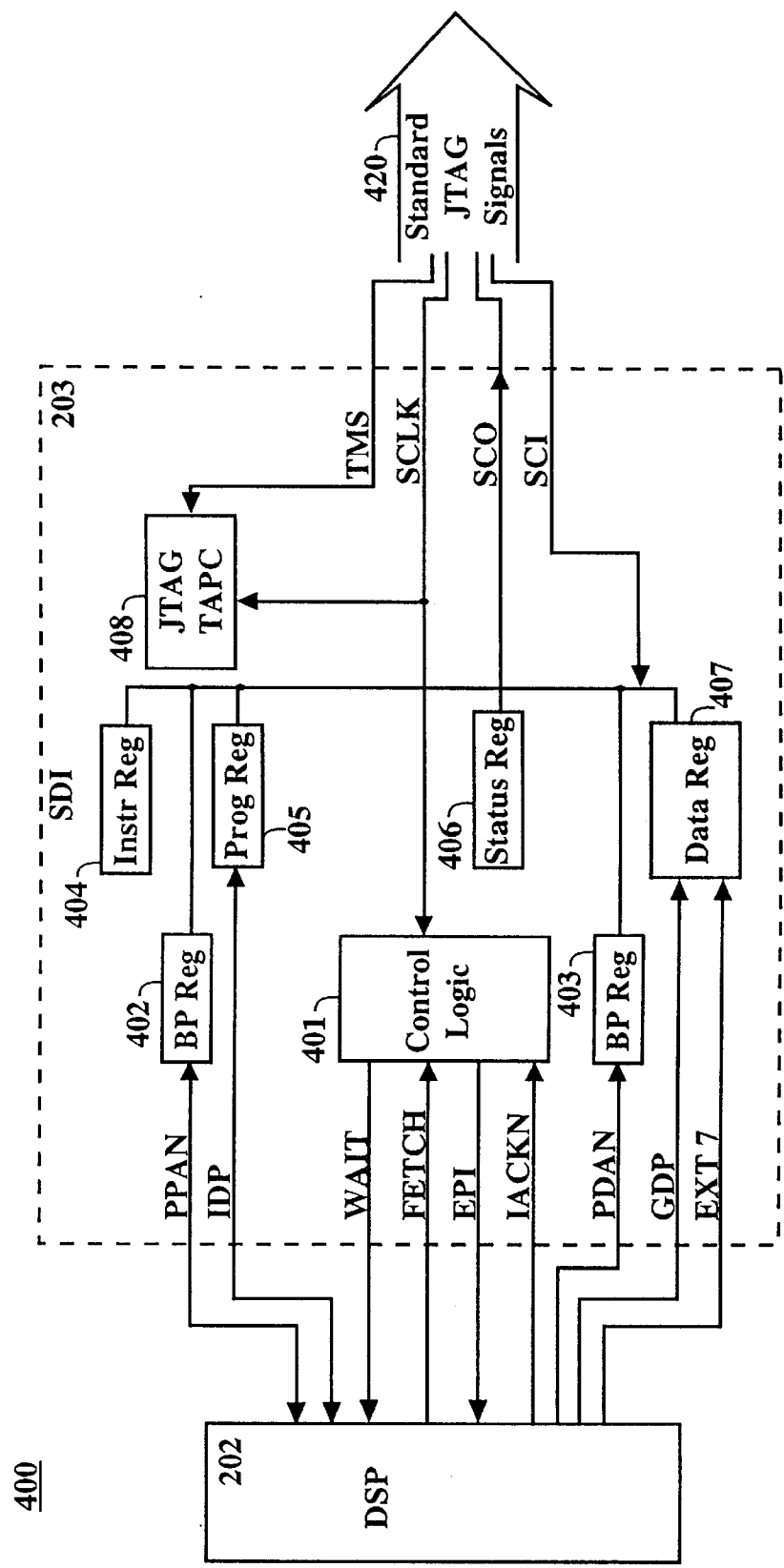
FIG. 4 shows a functional block diagram of a smart debug interface circuit in accordance with one embodiment of the present invention.

With reference now to FIG. 4, a functional block diagram 400 of a SDI 203 in accordance with one embodiment of the present invention is shown. It should be appreciated that diagram 400 shows one exemplary implementation of a portion of the functional blocks implementing the system of the present invention. As such, many details shown in diagram 400 can be changed without departing the scope of the present invention. Diagram 400 shows the DSP 202. In the present embodiment, DSP 202 comprises a Pine DSP core (or other similar core, e.g., Oak DSP core), from Digital Signal Processor Group Incorporated, Tel Aviv Israel. Thus, DSP signals PPAN, IDP, WAIT, FETCH, EPI, IACKN, PDAN, GDP, and EXT7 (hereafter referred to simply as DSP control signals), refer to the control signals of the Pine DSP core. The DSP control signals comprise the signals of the control bus 206 (shown in FIG. 2). Control logic 401 is coupled to the DSP control signals WAIT, FETCH, EPI, and IACKN. In general, the control logic 401 is responsible for directing and coordinating the operation of SDI 203. Breakpoint registers, BP reg 402 and BP reg 403, are coupled to PPAN and PDAN respectively. The DSP signals GDP and EXT7 are both coupled to data register 407. Program register 405 is coupled to IDP. The signals TMS, SCLK, SCO, and SCI are industry standard JTAG interface signals (hereafter referred to as JTAG signals) which are extensively described in the JTAG specification IEEE 1149.1-1990.

It should be appreciated that diagram 400 shows the functional blocks of SDI 203 which implements the JTAG compliant state machine. This state machine allows a standardized means of accessing the JTAG TAP controller 408 and utilizing the standard JTAG signals 420. The JTAG signals 420 comprise the JTAG interface bus 208 (shown in FIG. 2) which couples to host computer system 204. Thus, while portions of the standard JTAG serial bus are described herein, the structure and operation of the standard JTAG serial bus is well known and widely used by those skilled in the art. Those desiring additional details or knowledge of the standard JTAG serial bus are referred to the Institute of Electronic and Electrical Engineers (IEEE) Standard 1149.1.

It should further be noted that instruction register Inst reg 404 and program register Prog reg 405 are comprised of a plurality of scan cells (e.g., scan cells 300) as described in the discussion of FIG. 3. Thus, instruction register 404 and program register 405 avoid imposing a boundary scan delay, as described above. As such, the DSP 202 and other devices coupled to address lines of the instruction bus 205 or the data bus 207 are not slowed by instruction register 404 or program register 405, respectively.

Figure 5:
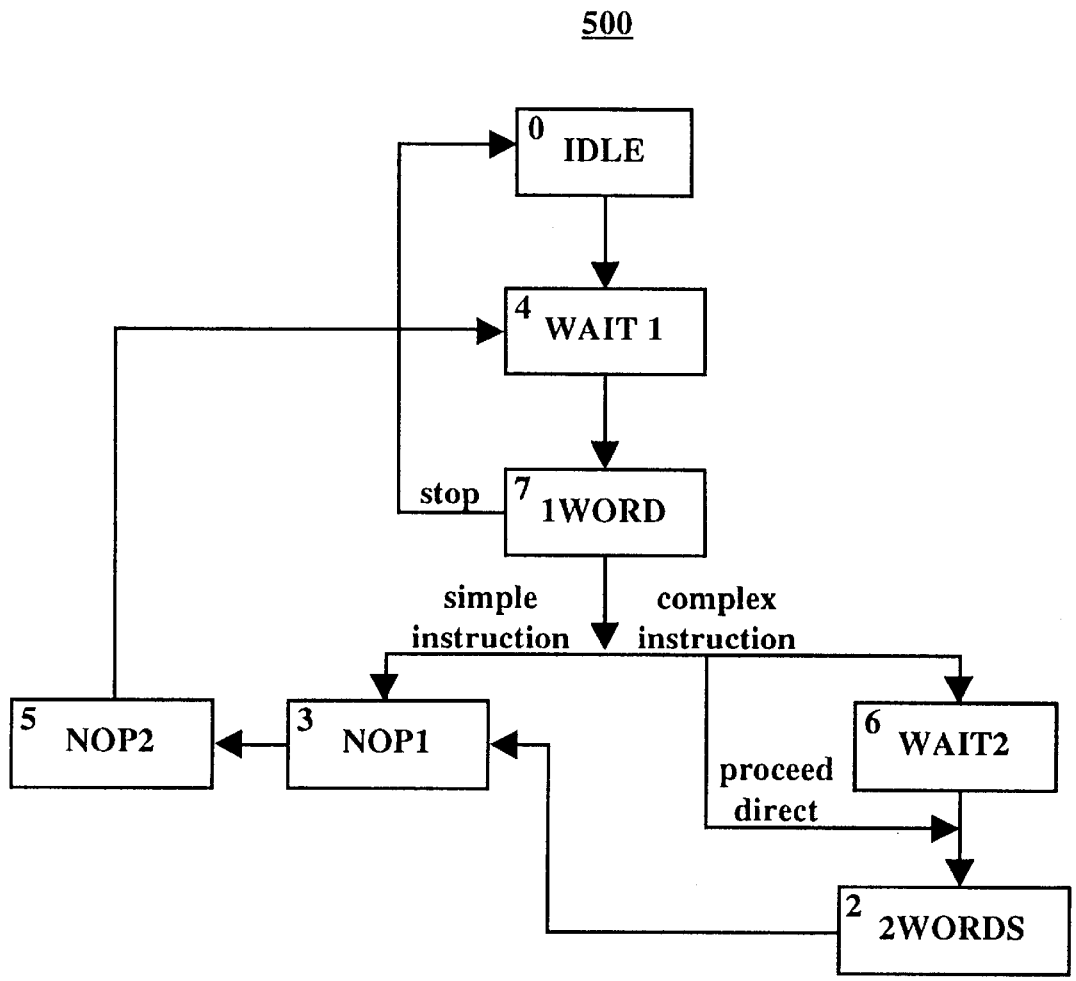
FIG. 5 shows a state machine having states in accordance with a method of one embodiment of the present invention.

With reference now to FIG. 5, a state machine 500 having states in accordance with a method of one embodiment of the present invention (e.g., system 200 of FIG. 2) is shown. State machine 500 is part of the control logic in accordance with the present invention and is implemented by functional block diagram 400 of FIG. 4. The individual states of state machine 500 comprise the steps of a method of one embodiment of the present invention. Each of the states of state machine 500 is uniquely numbered in the upper left corner.

At initial power up, a reset signal is applied to the logic of the SDI to place the SDI into a known state. In the present embodiment, this reset signal is shared with DSP 202, and the JTAG TAP controller 408 (both shown in FIG. 4) such that they are also placed into a known state. This places state machine 500 in state 0.

State 0 is the IDLE state. In state 0, the DSP 202 functions normally, fetching instructions from memory (e.g., memory 209) and executing the normal application software stored therein. State machine 500 remains in state zero until application processing is stopped by a debugging program on a host computer system via the SDI of the present invention (e.g., host computer system 204 and SDI 203 shown in FIG. 2).

State 4, the WAIT1 state, is entered by stopping the DSP and placing it into a wait state. In the present embodiment, the DSP is stopped by asserting a non-maskable interrupt request (NMI) via the SDI. The NMI stops application processing after completion of the instruction executing at the time the NMI was asserted. The SDI subsequently places the memory coupled to the instruction bus and data bus of the DSP into tristate, In addition, any other devices coupled to the instruction bus and data bus are tristated, as described above. Once the memory and any other coupled devices are tristated, the state machine exits WAIT1 and enters state 7.

In state 7, the 1WORD state, a word of an instruction is driven onto the instruction bus coupled to the DSP. The DSP of the present embodiment supports two levels of instruction complexity. Specifically, the DSP of the present embodiment supports simple instructions and complex instructions. Simple instructions are comprised of one word. Complex instructions are comprised of two words. Accordingly, when the instruction is a simple instruction, the state machine proceeds to state 3. When the simple instruction is a complex instruction, the state machine proceeds to state 6. Additionally, if the state machine receives a stop instruction prior to the execution of the first word, the state machine returns to state 0.

In state 3, the NOP1 state, the instruction executed in state 7 was a simple instruction. As such, the instruction executes in one cycle. However, the DSP of the present embodiment includes a three stage execution pipeline. Instructions in the pipeline move through one stage at a time. Hence, the SDI of the present invention needs to add two "no operation" (NOP) instructions to fill the pipeline as the one word simple instructions steps through. Thus, in state 3, the first NOP instruction is inserted and the state machine proceeds to state 5.

In state 5, the NOP2 state, the second NOP instruction is inserted. At this point, the DSP has completed the instruction. The state machine subsequently proceeds to state 4, WAIT1, and awaits the next instruction from the debugging program on the host computer system.

In state 6, the WAIT2 state, when the instruction is a complex instruction, the SDI of the present invention waits for the second word of the complex instruction. When the second word is received from the debugging program, the state machine proceeds to state 2. Alternatively, the state machine can proceed directly to the second word (e.g., state 2) of the complex instruction on the next clock cycle.

In state 2, the 2WORDS state, the second word of the complex instruction is received from the debugging program via the SDI of the present invention. The three stage pipeline is filled with the first word of the complex instruction and then the second word. The state machine subsequently proceeds to state 3. Hence, the SDI of the present invention adds two NOP instructions as described above. In state 3, the first NOP instruction is added and in state 5 the second NOP instruction is added. The state machine subsequently proceeds back to state 4, as described above, and waits for the next instruction.

It should be appreciated that the SDI of the present invention automatically provides the required number of NOP instructions to keep instructions flowing through the pipeline. The process of entering the NOP instructions is performed automatically by the logic of the SDI (e.g., SDI 203 shown in FIG. 4). The number of NOP instructions inserted depends upon the specific programmable digital processor the SDI is used with. For example, on a core with a two level pipeline, one NOP instruction is required, while on a core with a four level pipeline, three NOP instructions are required. As such, the present invention is readily adjusted to function with programmable digital processors having pipelines of differing lengths. The NOP instructions serve to "clean" the pipeline such that at any one time only one "true" instruction is being executed.

It should be appreciated that the SDI of the present invention functions with programmable digital processors (e.g., DSP 202) having circuitry supporting interrupts. Interrupts are required for those cases where the DSP is running an application and the user wants to stop and debug the application. The interrupt subsystem of the DSP is used to stop the DSP for the debug process. Once an NMI (non-maskable interrupt) is issued, the DSP will stop, automatically clean its pipeline, and issue an inteirrupt acknowledge, all at the completion of the currently executing instruction. The vector for the interrupt service routine is provided by the SDI. The memory is tristated and the SDI subsequently begins providing instructions to the DSP one at a time, stepping through the debugging process. When the debugging process is finished, the SDI issues a return from interrupt instruction and releases the memory from tristate. When the return from interrupt instruction is received by the DSP, it restarts at the address from which it was interrupted and continues executing the interrupted application.

Thus, the SDI of the present invention provides a diagnostic trouble shooting and debugging solution which provides the benefits of conventional test interfaces while avoiding their associated adverse impacts on the programmable digital processor system under test. The system of the present invention is fully controllable and compatible with the industry standard JTAG interface. The system of the present invention does not increase the size of the programmable digital pirocessor integrated circuit by including numerous serial scan cells. In addition, the system of the present invention does not impose a boundary scan delay by breaking the programmable digital processor busses with boundary scan cells. As a further advantage, the smart debug interface circuit of the present invention does not increase the amount of memory required to store the application software of the programmable digital processor system.

The present invention, a smart debug interface circuit, is thus described. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. With an programmable digital processor device including a memory and a programmable digital processor coupled to the memory via an instruction bus and a data bus, a method for debugging the programmable digital processor device, the method comprising the steps of:
   a) asserting a reset instruction to place a smart debug interface circuit coupled to a programmable digital processor of a device into a known state;
   b) placing said programmable digital processor into a wait state;
   c) issuing an instruction to said programmable digital processor via said smart debug interface circuit;
   d) issuing a no operation instruction via said smart debug interface circuit such that said programmable digital processor executes one instruction at a time, if said programmable digital processor includes a multistage pipeline; and
   e) placing said programmable digital processor into a wait state when said programmable digital processor completes execution of said instruction.

2. The method of claim 1 wherein step d) further includes the step of including a plurality of no operation instructions such that said programmable digital processor executes one instruction at a time, if said programmable digital processor includes a pipeline having a plurality of stages.

3. The method of claim 1 further including the steps of:
   issuing a first word of said instruction and subsequently issuing a second word of said instruction when said instruction is a two word instruction; and
   placing said programmable digital processor into a wait state when said programmable digital processor completes execution of said two word instruction such that said programmable digital processor executes one instruction at a time.

* * * * *